United States Patent [19]

Derbyshire et al.

[11] 4,404,177

[45] Sep. 13, 1983

[54] METHOD FOR PRODUCING GRAPHITE CRYSTALS

[75] Inventors: Francis J. Derbyshire, Ewing; Darrell D. Whitehurst, Titusville, both of N.J.

[73] Assignee: Mobil Oil Corporation, New York, N.Y.

[21] Appl. No.: 320,235

[22] Filed: Nov. 12, 1981

[51] Int. Cl.$^3$ .............................................. C01B 31/04
[52] U.S. Cl. .................................... 423/448; 156/603
[58] Field of Search ................. 423/448, 453; 156/603

[56] References Cited

U.S. PATENT DOCUMENTS 3,274,097 9/1966 Biehl .................................... 423/448

OTHER PUBLICATIONS

Noda et al.; "Growth of Iron Single Crystals of Graphite from a Carbon–Melt"; *Carbon*, 1968, vol. 6, pp. 813–816.
Derbyshire et al.; "The Formation of Graphite Films by Precipitation of Carbon From Nickel Foils"; *Carbon*, 1972, vol. 10, pp. 114–115.
Derbyshire et al.; "Graphite Formation by the Dissolution–Precipitation of Carbon in Cobalt, Nickel and Iron"; *Carbon*, 1975, vol. 13, pp. 111–113.
Derbyshire et al.; "Kinetics of the Deposition of Pyrolytic Carbon on Nickel"; *Carbon*, 1975, vol. 13, pp. 189–192.
Austerman et al., "Growth and Characterization of Graphite Single Crystals"; *Carbon*, 1967, vol. 5, pp. 549–557.

*Primary Examiner*—O. R. Vertiz
*Assistant Examiner*—Steven Capella
*Attorney, Agent, or Firm*—Michael G. Gilman; Charles J. Speciale; L. Gene Wise

[57] ABSTRACT

A process for continuously or semi-continuously producing and collecting highly oriented graphite crystals by diffusing carbon atoms through a heated Group VIII metal artifact such that they precipitate as graphite on a surface of the artifact. Diffusion of carbon atoms through the artifact is driven by maintaining a temperature differential across the artifact.

13 Claims, No Drawings

METHOD FOR PRODUCING GRAPHITE CRYSTALS

BACKGROUND OF THE INVENTION

1. Field of the Invention

This invention is concerned with a continuous or semi-continuous method for producing highly oriented graphite crystals.

2. Description of the Prior Art

The element carbon exists in three allotropic forms which are employed industrially—amorphous carbon, graphite and diamond. Carbon is also a major constituent of coal. In general, carbon is inert and infusible at atmospheric pressure. Some of the industrial applications of carbon depend upon its chemical inertness. One of the most useful forms of carbon is graphite. Graphite is a soft crystalline modification of carbon that differs greatly in its properties from both amorphous carbon and diamond.

Graphite, as it occurs naturally, has been known to man for many centuries. By the Middle Ages it was being employed for writing and drawing purposes. Natural graphite was the only kind available, except in laboratory quantities, until the first successful commercial process for artificial graphite was introduced by Edward Acheson in 1896. Acheson placed amorphous carbon together with certain catalysts such as silica or alumina in a furnace at temperatures about 3000° C. to produce graphite.

Graphite has unique properties which make it a very valuable material. Graphite has low friction and wear properties which render graphite useful as a lubricant and in bearings and seals. Since graphite is fairly chemically inert, it can be used with corrosive fluids, e.g., acids, salt solutions, alkalies and organic compounds. The easy-machining qualities of graphite, together with its availability in many sizes and shapes, permit construction of a complete range of process equipment, including heat exchangers, pumps, valves, pipes, fittings, towers, tank linings, storage chambers and absorbers. Foundry facings constitute the largest single use of natural graphite, followed by lubricants, steel-making, refractories and crucibles.

Even though graphite is a non-metal, graphite possesses very good electrical and thermal properties. The electrical industry uses graphite for electrodes, brushes, contacts, and electronic-tube rectifier elements. The high thermal conductivity of graphite is particularly important in heat-exchange applications. Graphite is used in the construction of shell and tube plate-type and double-pipe heat exchangers. Graphite is also highly resistant to thermal shock.

In the field of metallurgy, graphite is employed for electrodes in carbon-arc welding and in electric arc furnaces for steel melting. In other fields of metallurgical technology, graphite is utilized for hot-pressing dies, as susceptors in induction furnances, molds, and melting crucibles.

Structural shapes of extremely high purity graphite have become of great importance in nuclear energy applications, particularly nuclear reactors. Graphite blocks are used to hold the slugs of nuclear fuel in position in the space lattice which forms the nuclear reactor. The primary function of graphite, however, is to act as a moderator for the reactor core. Graphite is also used as a coating for uranium fuel and as a container for nuclear matter.

Graphite is now being extensively used in the field of space technology. Rocket nozzles and nose cones for space vehicles are being fabricated from graphite.

Commercial users of graphite include the pencil industry and the paint industry. Graphite is also used as a molecular sieve for absorbing gases and as a catalyst support. Another use for graphite is as a surgical implant, since graphite can be used safely in contact with body fluids.

Graphite can be derived from natural sources. United States production of graphite has been practically non-existant in recent years. Most of our supply of natural graphite is from imports, with Mexico being the prime supplier. Artificial graphite can be substituted for almost any of the uses of the natural product, and in many instances, high purity artificial graphite is preferred.

It is known that carbons of widely different properties can be prepared by starting with different carbonaceous materials and treating these materials in various ways. Carbons can be produced by starting with organic precursors, such as oil, coal, natural gas, organic compounds and polymers and heating such precursors at a sufficiently high temperature to liberate hydrogen, oxygen, nitrogen and sulfur.

Artificial graphite can be made electrically from retort or petroleum coke. Coke or vitreous carbon is heated to temperatures in excess of 2200° C. under hydrostatic pressure, with or without catalysts. By this method, the highly turbostatic starting material is formed into well crystallized graphite. Another approach is to grow graphite crystals from solution. The growth of graphite single crystals from a carbon-saturated metallic melt is taught by Austerman, Myron and Wagner, *Growth and Characterization of Graphite Single Crystals*, CARBON, Vol. 5, pp. 549–557, 1967, and Noda, Sumiyoshi and Ito, *Growth of Single Crystals of Graphite from a Carbon-Iron Melt*, CARBON, Vol. 6, pp. 813816, 1968.

U.S. Pat. No. 3,664,813 describes a process for making graphite whiskers on a metal covered substrate, wherein said substrate is in a whisker deposition zone of hydrocarbon whisker vapor and where there is a temperature gradient around said substrate. The growing whiskers are thus deposited on the substrate.

In U.S. Pat. No. 4,048,953, an apparatus is disclosed for the vapor deposition of pyrolytic carbon on porous sheets of carbon material. The pyrolytic carbon is deposited from a hydrocarbon gas which is heated to a very high temperature, i.e., 2000°–2400° C.

The formation of graphite films by dissolving carbon in cobalt and nickel at high temperatures with the film being produced by precipitation on cooling is discussed in the following references: F. J. Derbyshire, A. F. B. Presland and D. L. Trimm, CARBON, Vol. 10, pp. 114–115, (1972); F. J. Derbyshire, A. F. B. Presland and D. L. Trimm, *Graphite Formation By The Dissolution-Precipitation of Carbon in Cobalt, Nickel and Iron*, CARBON, Vol. 13, pp. 111–113, 1975; F. J. Derbyshire and D. L. Trimm, Kinetics of the Deposition of Pyrolytic Carbon on Nickel, CARBON, Vol. 13 pp. 189–192, 1975; R. T. K. Baker, P. S. Harris, J. Henderson, and R. B. Thomas, *Formation of Carbonaceous Deposits from the Reaction of Methane Over Nickel*, CARBON, Vol. 13, pp. 17–22, 1975.

Thus, the prior art discloses the use of heated Group VIII metals to deposit graphite via diffusion and subsequent precipitation on a batch-type basis. In prior art methods, after diffusion of carbon occurs through the heated metal, the carbon is deposited on a surface of the metal by allowing the metal to cool down and by thereafter collecting the precipitated graphite in a batch-type operation.

It is an object of the present invention to provide a process for the production of highly oriented graphite crystals in a continuous or semi-continuous operation. This and other objectives can be realized by means of the invention described herein.

SUMMARY OF THE INVENTION

The present invention provides an improved process for producing highly oriented graphite crystals in a continuous or semi-continuous manner. In such a process, a source or carbon atoms is supplied to one surface of a heated metal artifact through which a temperature gradient is maintained. Carbon atoms diffuse through the metal artifact, driven by the temperature gradient and precipitate as graphite crystals on a generally opposite and relatively cooler second surface of the artifact.

The metal artifact employed comprises one or more of the Group VIII metals or alloys thereof. Nickel, iron and cobalt are preferred for use as the artifact. The heated surface of the artifact is maintained at the temperature of from about 700° to 1800° C. and the cooler second surface is maintained at a temperature of from about 500° C. to 1250° C. A temperature differential of at least about 100° C. is maintained between the heated first artifact surface and the relatively cooler second metal artifact surface.

Carbon atoms which diffuse through the artifact precipitate as a film of graphite crystals on the relatively cooler second surface of the artifact. Such crystals can then be collected or recovered as they form.

DETAILED DESCRIPTION OF THE INVENTION

The present invention involves the formation of graphite crystals by diffusing carbon atoms through a heated metal artifact. Such an artifact comprises one or more of the metals of Group VIII of the Periodic Chart of the Elements (Fisher Scientific Company, Cat. No. 5-702-10) and alloys of such metals. Prefered Group VIII metals are iron, cobalt and nickel. Nickel is particularly preferred.

The artifact can be fashioned in any desired geometric configuration so long as both a carbon deposition surface and a graphite precipitation surface are provided. Generally, such surfaces are substantially parallel to one another. In such instances, artifact thickness preferably varies from 0.1 mm to 5 cm, more preferably from about 0.2 mm to 1 cm.

The metal artifact utilized is heated to temperatures which promote diffusion of carbon atoms therethrough. Thus, the artifact or at least one surface thereof, is heated to a temperature of from about 700° C. to 1800° C., preferably from about 900° C. to 1250° C. At such temperatures, the artifact can be in either solid state or molten state.

To initiate the process of the instant invention, a source of carbon is passed over a first surface of the heated metal artifact. The source of carbon can be either carbon-containing compounds or elemental carbon. Carbon-containing compounds useful herein can be either hydrocarbons or non-hydrocarbons. The carbon source introduced to the first surface of the metal artifact will generally be in the gaseous state.

Non-limiting examples of useful hydrocarbon sources include both aliphatic and aromatic compounds. Non-limiting aliphatic compounds include alkanes (paraffins), alkenes (olefins), alkynes and cyclic aliphatic compounds. Oxygenated hydrocarbons are also a source of carbon atoms for this invention. Such oxygenated hydrocarbons include alcohols, ethers, esters, carboxylic acids, aldehydes, ketones, amides, sulfonic acids, phenols, glycols and epoxides, merely to name a few. Hydrocarbons containing nitrogen such as amines, azo compounds, hydrazo compounds and urea, can also be utilized herein. Another useful source of carbon for this invention is substituted hydrocarbons, such as methyl chloride, methylene bromide, chloroform, etc.

Non-hydrocarbon carbon-containing compounds can also serve as a source of carbon for this invention. Non-limiting examples of such compounds are carbon monoxide, carbon dioxide, carbon disulfide, carbonyl sulfide, carbon tetrachloride, cyanide, etc.

If the carbon source is an organic compound, the carbon atoms will dissociate from the other element(s) in the compound upon contact with the hot metal surface, and then the carbon atoms will selectively diffuse through the metal artifact of the instant invention, while the other element(s) of the compound remain behind on and do not diffuse through the hot surface.

The most efficient process in accordance with the present invention occurs when all of the metal surface is available for reaction with the carbon source. In turn, this is dependent upon the reactivity of the carbon source fed to the metal surface, its pressure and the metal surface temperature. At low surface temperatures (ca. 600° C.), the mobility of carbon in, for example, nickel is very low. If the rate of production of carbon atoms on the surface is greater than the rate at which they diffuse into the bulk, a film of disordered carbon will form on the surface and can suppress further reaction. A similar situation can arise even at higher temperatures if the rate of carbon deposition is too high. In addition, even with less reactive gases, at high partial pressures, the reaction zone is no longer confined to the surface but extends to an "envelope" above the metal. Gas phase reactions can thus take place leading to the deposition of disordered carbons which may block the surface.

Given those considerations, it is preferred to adjust the carbon deposition rate and the metal surface temperature to maximize carbon diffusion through the metal barrier. Accordingly, suitable deposition rates can generally range from 2.0 to $55.0 \times 10^{-5}$ grams of carbon per cm$^2$ per minute of geometric surface, which surface is preferably heated within the temperature range of 900°–1250° C. A further means of reducing undesirable surface deposits under certain reaction conditions is to pre-anneal the metal surface in hydrogen. An example of effective pretreatment conditions is to heat to 800° K. or hither in 100 KPa of flowing hydrogen.

In accordance with the present invention, a temperature differential is maintained across the metal artifact such that carbon atoms diffuse through said artifact from the surface at which carbon was introduced toward a generally opposite, and relatively cooler, second surface of the artifact. The magnitude of such a temperature differential is at least 100° C., and preferably at least about 200° C. When such a differential is imposed across the artifact, the temperature of the generally opposite relatively cooler surface of the artifact can vary from about 500° C. to 1250° C., more preferably from about 600° C. to 1000° C.

The temperature differential can be imposed across the metal artifact by any known or conventional means. One method to attain a temperature differential across the useful metals of this invention is to employ a tapered metal artifact to which a constant amount of heat is applied. The tapering will result in a variation in resistance due to the variation in cross-sectional area, which would in turn lead to a variation in temperature. Heat could be supplied to said tapered metal artifact by any conventional means, such as by electrical means. Another method to impart a temperature differential would be to continuously heat one surface of the metal artifact and continuously cool an opposite surface.

Carbon atoms introduced to the heated first surface of the metal artifact diffuse through the artifact to the relatively cooler, second surface driven by the resulting temperature gradient. Such diffusing carbon atoms will precipitate on the relatively cooler artifact surface as crystalline graphite. By regulation of the operating conditions, it is possible to grow relatively thick films of crystalline graphite over one or more cooler surfaces by precipitation. The graphite so formed will be isotropic with the C-axes of the individual crystallites parallel to each other and perpendicular to the metal surface.

The criterion for growth rate of the graphite films on the cooler side of the metal artifact is the desired crystallinity and the relative thickness of the films along the c-axis (perpendicular to the metal surface) to that along the a-axis (parallel to the metal surface). Thin crystalline films (c-axis dimension of ca. 5 microns) which completely cover the metal surface can be formed in 20–30 minutes. To produce thicker films of high structural order could require growth rates as slow at $10^{-9}$ m/sec in the direction of the c-axis.

The process of the instant invention can be operated continuously or semi-continuously. Graphite growth rate can be controlled either by varying the magnitude of the temperature differential or by varying the partial pressure of the carbon source gas. In the former case, it is not necessary to attempt to match the deposition rate to the growth rate provided that it is at least equal to it. Under the conditions described, the rate of reaction in the steady state is controlled by the rate at which carbon atoms are removed from the metal by precipitation, and if the metal is fully saturated, there will be no further graphite deposition.

The precipitated graphite can be removed and collected from the cooler surface of the metal artifact by any convenient method, such as by mechanical scraping. Thus, for example, the metal artifact can be a rotating cylinder which has a cooler exterior than interior. The carbon source is deposited on the interior surface, and crystallites of graphite deposit on the outer surface where they are continuously removed by a "doctor" blade. The resulting crystallites are mixed with a suitable binder and formed by heating and moulding into a desired shape in which the crystallites are randomly overted. Alternatively, the mix can be extruded to align the crystallites before setting the matrix. In either instance, materials are produced which possess the unique properties of crystalline graphite and which are suitable for a wide variety of engineering applications. By the process of this invention graphite crystals can be produced in almost any desired shape. By modifying the shape of the metal surface, it is possible to form graphite specimens of varying forms and thicknesses.

Another example of an arrangement for collecting and utilzing graphite produced as desired herein takes advantage of the low coefficient of friction of graphite parallel to the a-axis which can be manufactured efficiently via the techniques of the present invention. Thus, in certain load-bearing applications it would be possible to fabricate the bearing surfce or a close fitting shell from one or more of the metals described. By treatment of the metal as described herein, a film of graphite can then be deposited on the load bearing surface whose c-axis is always perpendicular to the surface or surfaces with all the attendant advantages of continuously providing graphite as a lubricating agent.

The following examples serve to illustrate the present invention but are not limiting thereof.

EXAMPLE I

Methane at the rate of about 5 grams per minute per $cm^2$ of geometric surface area is continuously introduced to one surface of a 16 cm×10 cm nickel artifact which is 0.25 cm thick. The gas pressure is maintained at 1/25 of an atmosphere.

The surface at which the methane is introduced is continuously heated in order to maintain the surface at a temperature of about 1100° C. A temperature differential of about 150° C. is maintained across the artifact by continuously cooling a second artifact opposite the heated surface, in order to maintain the temperature of this opposite surface at about 950° C. (Temperature gradient of 600° C./cm).

At the heated artifact surface some of the methane dissociates, and the resulting carbon atoms diffuse into the nickel artifact. Driven by the temperature gradient, carbon atoms diffuse through the artifact and eventually precipitate on the cooler opposite surface as graphite crystals.

After about 40–60 minutes, the artifact is saturated with carbon. After an additional 10–20 minutes a 5 micron thick film of graphite forms on the cooler surface and is removed. Subsequent similar film growth again occurs after another 10–20 minutes.

EXAMPLE II

In a procedure similar to that described in Example I, graphite is formed on the cooler surface of a nickel artifact using ethane as the carbon source. The ethane flow rate is 10 grams per minute per $cm^2$ of geometric artifact surface. Gas pressure is maintained at 1/75 of an atmosphere. The heated surface of the artifact is maintained at a temperature of 1050° C., and a temperature gradient of 400° C./cm through the artifact provides a cooler surface temperature of 950° C.

The time to initially saturate the artifact with carbon from the ethane source is 30–40 minutes. Each 5 micron thick graphite film is formed in 8–10 minutes.

EXAMPLE III

In another procedure similar to that described in Examples I and II, graphite is formed on the cooler surface of a nickel artifact using ethylene as the carbon source. The ethylene flow rate is 8 grams/minute/$cm^2$ of geometric artifact surface. Gas pressure is maintained at 1/150 of an atmosphere. The heated surface of the artifact is maintained at a temperature of 100° C., and a temperature gradient of 800° C./cm through the artifact provides a cooler surface temperature of 900° C.

The time to initially saturate the artifact with carbon from the ethylene source is about 15 minutes. Each 5 micron thick graphite film is formed in about 10 minutes.

Graphite film formation in a manner similar to that exemplified in Examples I–III can be realized by using as a carbon source in the Examples I–III procedure an equivalent amount of propane, benzene, cyclohexane, methanol, methylene, chloride, carbon dioxide, phenol, ethylene glycol or urea.

What is claimed is:

1. An improved process for continuously or semi-continuously producing highly oriented graphite crystals, said process comprising:
   (A) introducing a source of carbon atoms to a first surface of an artifact comprising a Group VIII metal or mixture of Group VIII metals, said first surface being maintained at a temperature of from about 700° C. to 1800° C.,
   (B) maintaining a temperature differential of at least 100° C. across said artifact such that carbon atoms diffuse through said artifact to a generally opposite solid second surface of said artifact, said second surface being maintained at a temperature of from about 500° C. to 1250° C.; and
   (C) collecting graphite crystals which form on said second surface from carbon atoms which have diffused through said artifact.

2. The process of claim 1 wherein said first surface has a temperature between about 900° C. and 1250° C.; and
   said second surface has a temperature between about 600° C. and 1000° C.

3. The process of claim 2 wherein said artifact is in the solid state.

4. The process of claim 2 wherein the first surface of said artifact is in the molten state.

5. The process of claim 2 wherein said Group VIII metal is selected from the group consisting of cobalt, nickel and iron.

6. The process of claim 5 wherein said Group VIII metal is cobalt.

7. The process of claim 5 wherein said Group VIII metal is nickel.

8. The process of claim 2 wherein the graphite is collected by mechanical scraping of said second surface of the artifact.

9. The process of claim 1 wherein the carbon source is elemental carbon.

10. The process of claim 1 wherein the carbon source is a hydrocarbon.

11. The process of claim 1 wherein the carbon source is a non-hydrocarbon carbon containing compound.

12. The process of claim 2 wherein said temperature differential is attained by continuously heating one surface of the artifact and continuously cooling an opposite surface.

13. The process of claim 12 wherein a temperature differential of at least 200° C. is maintained.

* * * * *